United States Patent
Lee et al.

(10) Patent No.: US 8,552,123 B2
(45) Date of Patent: Oct. 8, 2013

(54) THERMOSETTING RESIN, COMPOSITION INCLUDING THE SAME, AND PRINTED BOARD FABRICATED USING THE SAME

(75) Inventors: Jae-Jun Lee, Suwon-si (KR); Myung-Sup Jung, Gyeonggi-do (KR)

(73) Assignees: Samsung Electronics Co., Ltd. (KR); Samsung Electro-Mechanics Co., Ltd. (KR); Samsung Fine Chemicals Co., Ltd. (KR)

( * ) Notice: Subject to any disclaimer, the term of this patent is extended or adjusted under 35 U.S.C. 154(b) by 334 days.

(21) Appl. No.: 12/859,425

(22) Filed: Aug. 19, 2010

(65) Prior Publication Data

US 2011/0236701 A1   Sep. 29, 2011

(30) Foreign Application Priority Data

Mar. 24, 2010   (KR) .................. 10-2010-0026312

(51) Int. Cl.
   *C08G 63/00*   (2006.01)
(52) U.S. Cl.
   USPC ...... 525/437; 428/458; 252/299.01; 524/104; 524/114; 524/606; 528/170
(58) Field of Classification Search
   USPC .............. 525/437; 428/458; 252/299.01; 524/104, 114, 606; 528/170
   See application file for complete search history.

(56) References Cited

U.S. PATENT DOCUMENTS

2010/0155120 A1* 6/2010 Lee et al. ............ 174/258

FOREIGN PATENT DOCUMENTS

| JP | 61-021132 A | 1/1986 |
|---|---|---|
| JP | 61-073724 A | 4/1986 |
| JP | 63-015831 A | 1/1988 |
| JP | 01-266124 A | 10/1989 |
| JP | 02-212512 A | 8/1990 |
| JP | 04-153214 A | 5/1992 |
| JP | 05-222164 A | 8/1993 |
| JP | 05-326754 A | 12/1993 |
| JP | 06-136056 A | 5/1994 |
| JP | 06-322072 A | 11/1994 |
| JP | 09-316172 A | 12/1997 |
| JP | 11-021531 A | 1/1999 |
| JP | 2004-002373 A | 1/2004 |
| JP | 2004-269590 A | 9/2004 |

(Continued)

*Primary Examiner* — Shane Fang
(74) *Attorney, Agent, or Firm* — Cantor Colburn LLP

(57) ABSTRACT

A thermosetting resin including at least one repeating unit represented by the following Chemical Formula 1:

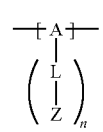

[Chemical Formula 1]

wherein, in Chemical Formula 1, A is derived from a phenolic moiety, an anilinic moiety, or a combination thereof, L is C(O)O, C(O)NR' wherein R' is hydrogen, a substituted or unsubstituted C1 to C20 alkyl group, a substituted or unsubstituted C6 to C30 aryl group, or a substituted or unsubstituted C6 to C30 aryloxy group, an aromatic ester, an aromatic ester-imide, an aromatic ester-amide, an aromatic amide, or a combination thereof, Z is a substituted or unsubstituted aliphatic group including a double bond or a triple bond, a substituted or unsubstituted alicyclic group including a double bond or a triple bond, a substituted or unsubstituted aryl group including a double bond or a triple bond, (iso) cyanate, a derivative thereof, or a combination thereof, and n is an integer ranging from 1 to about 4.

17 Claims, 2 Drawing Sheets

(56) References Cited

FOREIGN PATENT DOCUMENTS

| | | |
|---|---|---|
| JP | 2008-133454 A | 6/2008 |
| KR | 1020030045804 A | 6/2003 |
| WO | 94/03517 A1 | 2/1994 |

\* cited by examiner

THERMOSETTING RESIN, COMPOSITION INCLUDING THE SAME, AND PRINTED BOARD FABRICATED USING THE SAME

CROSS-REFERENCE TO RELATED APPLICATION

This application claims priority to Korean Patent Application No. 10-2010-0026312, filed on Mar. 24, 2010, and all the benefits accruing therefrom under 35 U.S.C. §119, the content of which in its entirety is herein incorporated by reference.

BACKGROUND

1. Field

This disclosure relates to a thermosetting resin, a thermosetting resin composition, and a printed circuit board fabricated using the same.

2. Description of the Related Art

Various electronic devices such as computers, semiconductor devices, displays, and communication devices include printed electronic circuit boards. A printed electronic circuit board may include signal lines for transferring signals, insulating layers for preventing a short circuit between signal lines, switching elements, and the like.

The printed electronic circuit board may desirably have various performance factors to provide improved performance. For example, a printed electronic circuit may be formed as a thin film to improve the performance of an electronic device, and the printed electronic circuit may be very small in size.

Particularly, a board such as a copper foil laminate having a low-dielectric characteristic and a low-dielectric loss tangent characteristic is desirable in order to reduce loss of information and signal delay. Generally, signal delay in a flexible printed circuit ("FPC") is increased in proportion to the square root of a relative dielectric constant of an insulation material around the wire, and a flexible printed circuit ("FPC") to provide a high transmission rate desirably has a resin composition having a low dielectric rate. However, because copper foil laminates which are generally used at present have a relatively large permitivity of about 4.5 to about 5.5, transmission loss and signal delay may be greater. Also, such board materials may hardly satisfy the specifications for next-generation packaging technology, such as excellent physical properties, high heat resistance, low thermal expansion, and low-moisture absorption. Therefore there remains a need for an improved board material that may provide such specifications.

Recently, researchers have been studying technologies which use a liquid crystal polymer resin, and particularly, a thermoplastic liquid crystal polymer ("LCP") is regarded as an alternative material for a polyimide ("PI"), which is being used as a flexible copper foil laminate, which may be a rigid or flexible board material. This is because the liquid crystal polymer addresses many of the problems of the polyimide, which include high moisture absorption, dimensional instability, and large dielectric rate and dielectric loss values. Also, because a liquid crystal polymer resin has low dielectric rate and loss values even at a high frequency ("GHz"), it has excellent electrical characteristics.

A commercially available liquid crystal polymer has excellent electrical characteristics and a low coefficient of thermal expansion ("CTE") due to low dielectric rate and loss values. Thus, researchers are studying use of the commercially available liquid crystal polymer as a rigid or flexible board material and an interlayer dielectric material. The commercially available liquid crystal polymer, however, has a drawback that it may be difficult to use as a flexible printed circuit ("FPC") due to low stiffness and insufficient heat resistance, when the commercially available liquid crystal polymer is used alone. In the process of preparing a prepreg or laminating the prepreg with copper foil in order to fabricate a flexible printed circuit ("FPC") using a liquid crystal polymer, a fusible LCP has lower workability, and a soluble LCP has a low glass transition temperature ("Tg"), a high processing temperature, and high viscosity of solid components, and thus the soluble LCP has a poor impregnation property and poor wettability on the surface of copper foil. Thus there remains a need for a soluble LCP having improved adhesion properties.

SUMMARY

According to one aspect of this disclosure, a thermosetting resin includes at least one repeating unit represented by the following Chemical Formula 1:

[Chemical Formula 1]

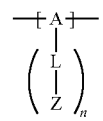

wherein, in Chemical Formula 1, A is derived from a phenolic moiety, an anilinic moiety, or a combination thereof, L is C(O)O, C(O)NR', where R' is hydrogen, a substituted or unsubstituted C1 to C20 alkyl group, a substituted or unsubstituted C6 to C30 aryl group, or a substituted or unsubstituted C6 to C30 aryloxy group, an aromatic ester, an aromatic ester-imide, an aromatic ester-amide, an aromatic amide, or a combination thereof, Z is a substituted or unsubstituted aliphatic group including a double bond or a triple bond, a substituted or unsubstituted alicyclic group including a double bond or a triple bond, a substituted or unsubstituted aryl group including a double bond or a triple bond, (iso) cyanate, a derivative thereof, or a combination thereof, and n is an integer ranging from 1 to about 4.

In an embodiment, A is at least one selected from the following Chemical Formulae 2-1 to 2-7.

[Chemical Formula 2-1]

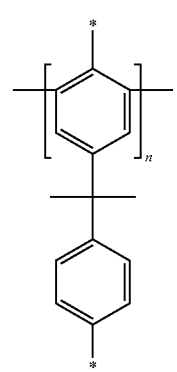

[Chemical Formula 2-2]

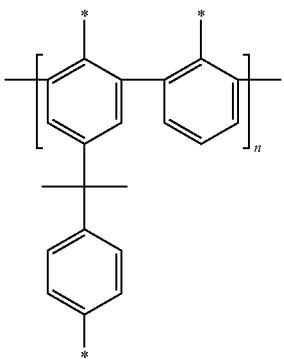

[Chemical Formula 2-3]

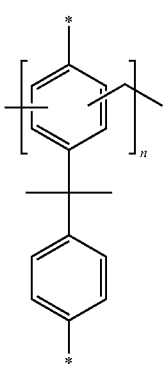

[Chemical Formula 2-4]

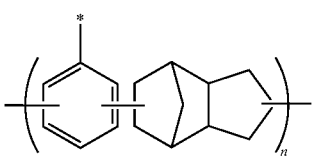

[Chemical Formula 2-5]

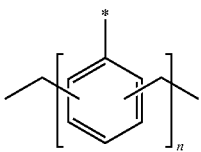

[Chemical Formula 2-6]

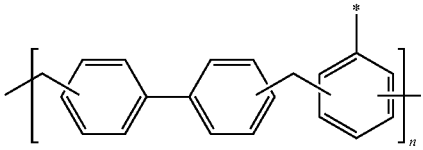

[Chemical Formula 2-7]

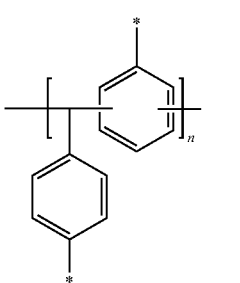

wherein, in Chemical Formulae 2-1 to 2-7, the repeating unit is unsubstituted, or some or all hydrogens of the aromatic ring of the repeating unit are substituted with a substituted or unsubstituted C1-C20 alkyl group, a substituted or unsubstituted C1-C20 alkoxy group, a substituted or unsubstituted C6-C30 aryl group, a substituted or unsubstituted C6-C30 cycloalkyl group, a substituted or unsubstituted C1-C20 aliphatic group including a double bond or a triple bond, or a combination thereof, n is an integer ranging from 1 to about 50, and * indicates a linkage to the L group.

In an embodiment, L is selected from an ester (C(O)O), an amide (C(O)NR'), and a repeating unit of the following Chemical Formula 3, where R' is hydrogen, a substituted or unsubstituted C1 to C20 alkyl group, a substituted or unsubstituted C6 to C30 aryl group, or a substituted or unsubstituted C6 to C30 aryloxy group.

In an embodiment, L includes a repeating unit of the following Chemical Formula 3

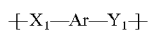 [Chemical Formula 3]

wherein, in Chemical Formula 3, Ar is independently a substituted or unsubstituted C6-C30 aromatic cyclic group, and Ar includes at least one aromatic cyclic group; $X_1$ and $Y_1$ are independently selected from C(O)O, O, C(O)NR', and NR", where R' and R" are independently hydrogen, a substituted or unsubstituted C1 to C20 alkyl group, a substituted or unsubstituted C6 to C30 aryl group, or a substituted or unsubstituted C6 to C30 aryloxy group, provided that at least one of $X_1$ and $Y_1$ are C(O)O or C(O)NR.

In an embodiment, L includes at least one of the following Chemical Formulae 4-1 to 4-3.

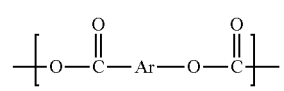

[Chemical Formula 4-1]

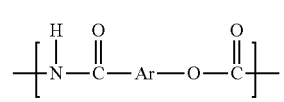

[Chemical Formula 4-2]

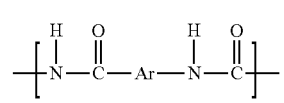

[Chemical Formula 4-3]

wherein, in Chemical Formulae 4-1 to 4-3, Ar is independently a substituted or unsubstituted C6-C30 aromatic cyclic group, and Ar includes at least one aromatic cyclic group.

The aromatic cyclic group may be at least one selected from the following Chemical Formulae 5-1 to 5-4.

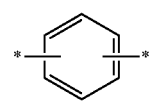

[Chemical Formula 5-1]

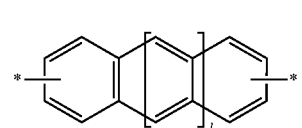

[Chemical Formula 5-2]

In Chemical Formula 5-2, l is an integer ranging from 0 to about 3.

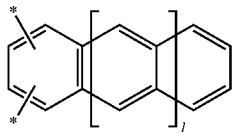
[Chemical Formula 5-3]

In Chemical Formula 5-3, l is an integer ranging from 0 to about 3.

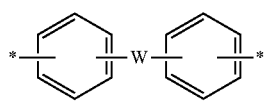
[Chemical Formula 5-4]

In Chemical Formula 5-4, W is selected from a single bond, O, S, CO, SO, $SO_2$, —N=N—, —C=N—, a substituted or unsubstituted C1 to C20 alkylene group, a substituted or unsubstituted C1 to C20 alkenyl group, a substituted or unsubstituted C6 to C30 arylene group, C(O)NR', a linker of the following Chemical Formula 5-4a, and a linker of the following Chemical Formula 5-4b, where R' is selected from hydrogen, a substituted or unsubstituted C1 to C20 alkyl group, a substituted or unsubstituted C6 to C30 aryl group, and a substituted or unsubstituted C6 to C30 aryloxy group, and at least one CH of the aromatic ring is unsubstituted, or replaced by at least one heteroatom such as N, O, S, and P,

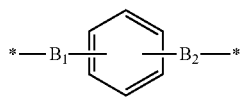
[Chemical Formula 5-4a]

wherein, in Chemical Formula 5-4a, $B_1$ and $B_2$ are independently linkers selected from O, S, CO, SO, and $SO_2$,

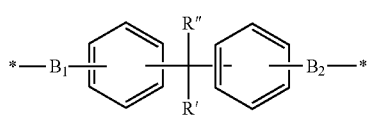
[Chemical Formula 5-4b]

wherein, in Chemical Formula 5-4b, $B_1$ and $B_2$ are independently linkers selected from O, S, CO, SO, and $SO_2$, and R' and R" are independently selected from hydrogen, a halogen, a substituted or unsubstituted C1 to C20 alkyl group, a substituted or unsubstituted C1 to C20 haloalkyl group, a substituted or unsubstituted C1 to C20 alkoxy group, a substituted or unsubstituted C6 to C30 aryl group, and a substituted or unsubstituted C6 to C30 aryloxy group.

In an embodiment, Z is at least one of the following Chemical Formulae 6-1 to 6-7:

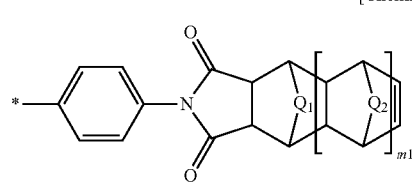
[Chemical Formula 6-1]

wherein, in Chemical Formula 6-1, $Q_1$ and $Q_2$ are independently a methylene group, O, or S, and m1 is 0 to 2,

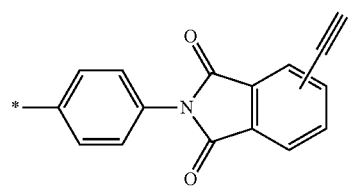
[Chemical Formula 6-2]

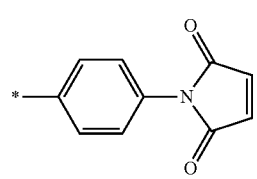
[Chemical Formula 6-3]

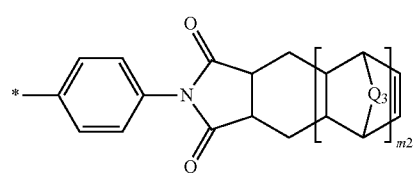
[Chemical Formula 6-4]

wherein, in Chemical Formula 6-4, $Q_3$ is a methylene group, O, or S, and m2 is 0 to 2,

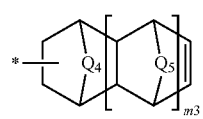
[Chemical Formula 6-5]

wherein, in Chemical Formula 6-5, $Q_4$ and $Q_5$ are independently a methylene group, O, or S, and m3 is 0 to 2,

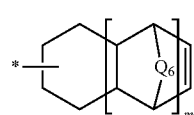
[Chemical Formula 6-6]

wherein, in Chemical Formula 6-6, $Q_6$ is a methylene group, O, or S, and m4 is 0 to 2,

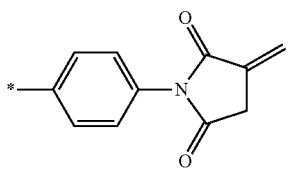

[Chemical Formula 6-7]

wherein, in Chemical Formulae 6-1 to 6-7, each carbon is unsubstituted, or is independently substituted with a halogen, a substituted or unsubstituted C1 to C20 alkyl group, a substituted or unsubstituted C1 to C20 alkoxy group, a substituted or unsubstituted C6 to C30 aryl group, a substituted or unsubstituted C6 to C30 aryloxy group, or a combination thereof.

A resin composition according to another embodiment may include a thermosetting resin represented by the above Chemical Formula 1.

The composition may further include at least one of an aprotic solvent, a maleimide-based compound, or an epoxy compound.

A film, prepreg, or board according to an embodiment of this disclosure may be fabricated using a thermosetting resin composition.

A flexible printed circuit ("FPC") according to an embodiment of this disclosure may include a prepreg prepared using a thermosetting resin composition.

Hereinafter, further aspects will be described in further detail.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
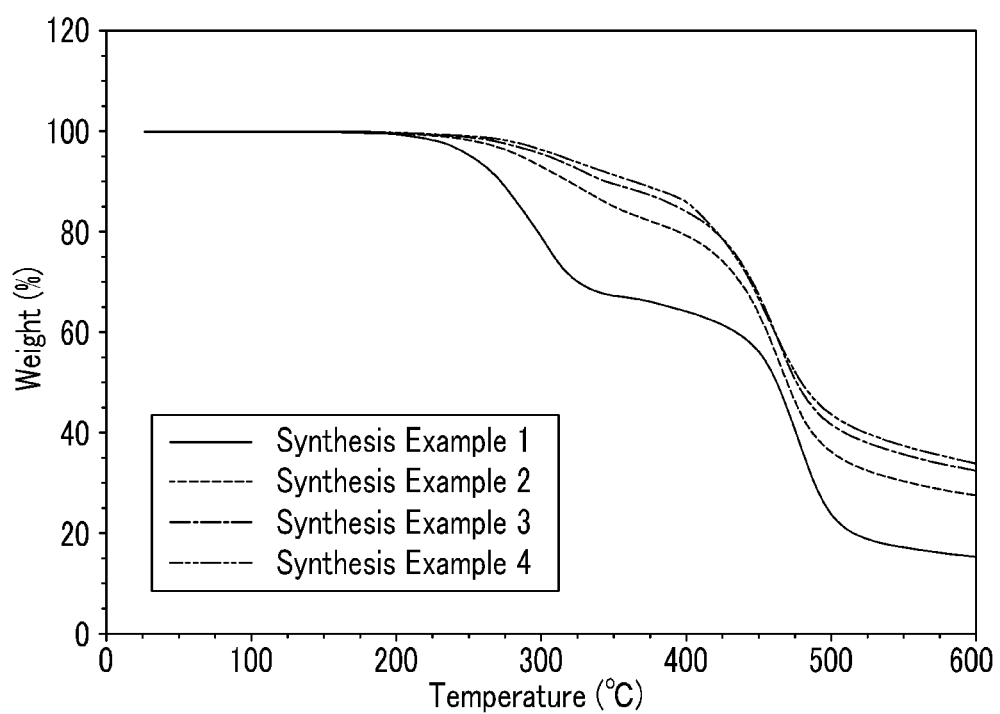
FIG. 1 is a thermogravimetric analysis ("TGA") graph of weight (percent, %) versus temperature (degrees centigrade, °C.) of the compounds prepared according to Synthesis Examples 1 to 4.

This disclosure will be described more fully hereinafter with reference to the accompanying drawings, in which embodiments are shown. This disclosure may, however, be embodied in many different forms and is not to be construed as limited to the exemplary embodiments set forth herein.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, unless otherwise provided, the term "substituted" refers to a compound or radical substituted with at least one (e.g., 1, 2, 3, 4, 5, 6, or more) substituents independently selected from the group consisting of a halogen, a C1 to C20 haloalkyl group, a C1 to C20 alkyl group, a C1 to C20 alkoxy group, a C6 to C30 aryl group, and a C6 to C30 aryloxy group, and a combination thereof, instead of hydrogen, provided that the substituted atom's normal valence is not exceeded.

As used herein, unless a specific definition is otherwise provided, the term "heteroaryl" refers to a group that comprises at least one member that is a heteroatom (e.g., 1 to 3 heteroatoms that are independently N, O, S, or P). Heteroaryl groups comprise at least one aromatic ring that contains a heteroatom ring member. Non-aromatic and/or carbocyclic rings may also be present in a heteroaryl group, provided that at least one ring is both aromatic and contains a ring member that is a heteroatom. For example, non-limiting examples of a heteroaryl includes pyrazinyl, furanyl, thienyl, pyridyl, pyrimidinyl, isothiazolyl, oxazolyl, thiazolyl, rylolyl, triazolyl, and 1,2,4-thiadiazolyl.

As used herein, unless a specific definition is otherwise provided, the term "heterocyclic group" may refer to a C2-C20 heterocycloalkyl group, a C2-C20 heterocycloalkenyl group, or a C2-C20 heterocycloalkynyl group, each including one or more heteroatoms such as N, O, P, S, or the like, in addition to carbon atoms.

Thermosetting Resin

A thermosetting resin prepared according to an may include at least one repeating unit represented by the following. Chemical Formula 1 and derived from a phenol-based compound or an aniline-based compound.

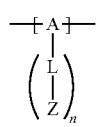

[Chemical Formula 1]

In Chemical Formula 1,

A is a phenol-based functional group, an aniline-based functional group, or a combination thereof, L is an ester (C(O)O), an amide (C(O)NR'), wherein R' is hydrogen, a substituted or unsubstituted C1 to C20 alkyl group, a substituted or unsubstituted C6 to C30 aryl group, or a substituted or unsubstituted C6 to C30 aryloxy group, an aromatic ester, an aromatic ester-imide, an aromatic ester-amide, an aromatic amide, or a combination thereof, Z is a substituted or unsubstituted aliphatic group including a double bond or a triple bond, a substituted or unsubstituted alicyclic group including a double bond or a triple bond, a substituted or unsubstituted aryl group including a double bond or a triple bond, (iso) cyanate, a derivative thereof, or a combination thereof, and n is an integer ranging from 1 to about 4.

A and L may be linked to each other through an ester group or an amide group. In a specific embodiment, the ether oxygen of the ester group is derived from the phenolic oxygen. In another specific embodiment, the nitrogen of the amide group is derived from the anilinic nitrogen.

The aliphatic functional group may refer to a linear organic functional group without a cyclic structure in its molecular structure, and the aromatic cyclic group may have a cyclic structure in which unsaturated bonds, lone pairs, and the like are mixed. Thus, in an embodiment the electrons of a functional group may be delocalized and various resonance forms may exist. The alicyclic functional group may be an organic functional group having a cyclic structure in its molecular structure, and may exclude an aromatic functional group.

A may constitute a backbone of the thermosetting resin, and in one embodiment, may be selected from the following Chemical Formulae 2-1 to 2-7.

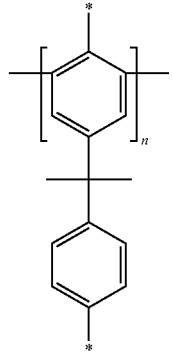

[Chemical Formula 2-1]

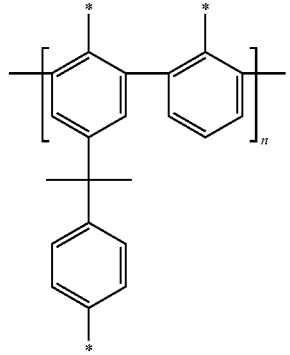

[Chemical Formula 2-2]

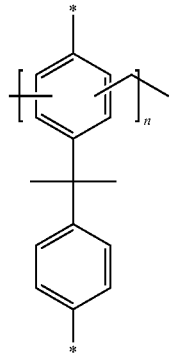

[Chemical Formula 2-3]

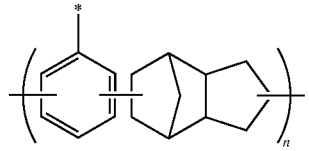

[Chemical Formula 2-4]

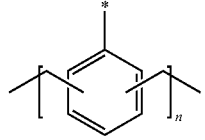

[Chemical Formula 2-5]

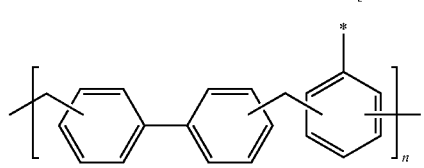

[Chemical Formula 2-6]

[Chemical Formula 2-7]

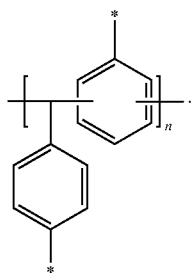

In Chemical Formulae 2-1 to 2-7, the repeating unit is unsubstituted, or some or all carbons of the aromatic ring of the repeating unit are substituted with a substituted or unsubstituted C1-C20 alkyl group, a substituted or unsubstituted C1-C20 alkoxy group, a substituted or unsubstituted C6-C30 aryl group, a substituted or unsubstituted C6-C30 cycloalkyl group, a substituted or unsubstituted C1-C20 aliphatic group including a double bond or a triple bond, or a combination thereof, n is an integer ranging from 1 to about 50, specifically about 2 to about 40, more specifically about 4 to about 30, and * indicates a linkage to the L group.

L is a functional group linking the backbone of the thermosetting resin and a terminal end, and is selected from an ester (C(O)O), an amide (C(O)NR') where R' is independently hydrogen, a substituted or unsubstituted C1 to C20 alkyl group, a substituted or unsubstituted C6 to C30 aryl group, or a substituted or unsubstituted C6 to C30 aryloxy group, and a repeating unit of the following Chemical Formula 3.

[Chemical Formula 3]

$-\!\!\left[X_1-Ar-Y_1\right]\!\!-$

In Chemical Formula 3, Ar is independently a substituted or unsubstituted C6-C30 aromatic cyclic group, and Ar includes at least one aromatic cyclic group; $X_1$ and $Y_1$ are independently selected from C(O)O, O, C(O)NR', and NR", where R' and R" are independently hydrogen, a substituted or unsubstituted C1 to C20 alkyl group, a substituted or unsubstituted C6 to C30 aryl group, or a substituted or unsubstituted C6 to C30 aryloxy group, provided that at least one of $X_1$ and $Y_1$ are C(O)O or C(O)NR'.

In one embodiment, L includes at least one repeating unit of the following Chemical Formulae 4-1 to 4-3.

[Chemical Formula 4-1]

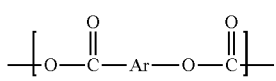

[Chemical Formula 4-2]

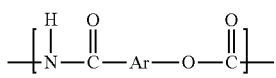

[Chemical Formula 4-3]

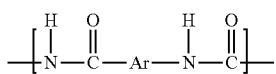

In Chemical Formulae 4-1 to 4-3, Ar is independently a substituted or unsubstituted C6-C30 aromatic cyclic group. The aromatic cyclic group has a cyclic structure in which unsaturated bonds, lone pairs, and the like are mixed. Thus, in an embodiment, electrons of a functional group may be delocalized and various resonance forms may exist. Examples of the aromatic cyclic group include a C5-C20 cycloalkenyl group, a C4-C20 heterocycloalkenyl group, a C6-C30 aryl group, a C2-C30 heteroaryl group, a C2-C30 heteroaryloxy group, or the like. The term "hetero" refers to one in which at least one CH group is replaced by a heteroatom such as N, O, S, or P. Ar may include at least one aromatic ring group.

In one embodiment, the aromatic cyclic group may be at least one selected from the following Chemical Formulae 5-1 to 5-4.

[Chemical Formula 5-1]

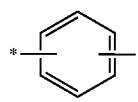

[Chemical Formula 5-2]

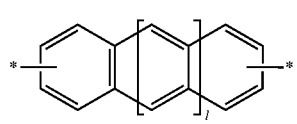

In Chemical Formula 5-2, 1 is an integer ranging from 0 to about 3, specifically about 1 to about 2.

[Chemical Formula 5-3]

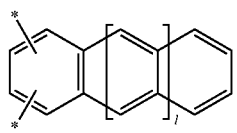

In Chemical Formula 5-3, 1 is an integer ranging from 0 to about 3, specifically about 1 to about 2.

[Chemical Formula 5-4]

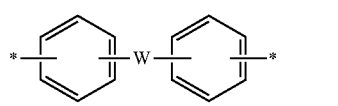

In Chemical Formula 5-4, W is selected from a single bond, O, S, CO, SO, $SO_2$, —N=N—, —C=N—, a substituted or unsubstituted C1 to C20 alkylene group, a substituted or unsubstituted C1 to C20 alkenyl group, a substituted or unsubstituted C6 to C30 arylene group, C(O)NR', a linker of the following Chemical Formula 5-4a, and a linker, of the following Chemical Formula 5-4b, where R' is selected from hydrogen, a substituted or unsubstituted C1 to C20 alkyl group, a substituted or unsubstituted C6 to C30 aryl group, and a substituted or unsubstituted C6 to C30 aryloxy group, and at least one CH of the aromatic ring is unsubstituted, or replaced by at least one heteroatom such as N, O, S, and P.

[Chemical Formula 5-4a]

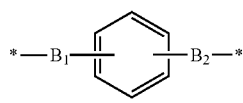

In Chemical Formula 5-4a, $B_1$ and $B_2$ are independently linkers selected from O, S, CO, SO, and $SO_2$.

[Chemical Formula 5-4b]

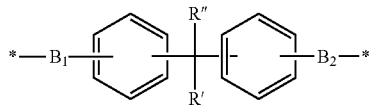

In Chemical Formula 5-4b, $B_1$ and $B_2$ are independently linkers selected from O, S, CO, SO, and $SO_2$, and R' and R" are independently selected from hydrogen, a halogen, a substituted or unsubstituted C1 to C20 alkyl group, a substituted or unsubstituted C1 to C20 haloalkyl group, a substituted or unsubstituted C1 to C20 alkoxy group, a substituted or unsubstituted C6 to C30 aryl group, and a substituted or unsubstituted C6 to C30 aryloxy group.

Z is a thermally curable reactive functional group, and in an embodiment, is at least one of the following Chemical Formulae 6-1 to 6-7.

[Chemical Formula 6-1]

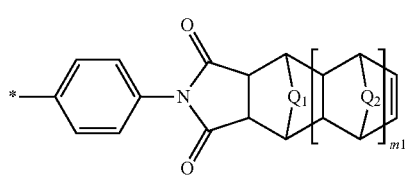

In Chemical Formula 6-1, $Q_1$ and $Q_2$ are independently a methylene group, O, or S, and m1 is 0 to about 2, specifically about 1.

[Chemical Formula 6-2]

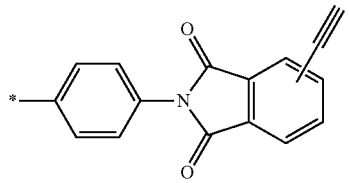

[Chemical Formula 6-3]

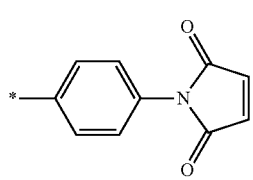

[Chemical Formula 6-4]

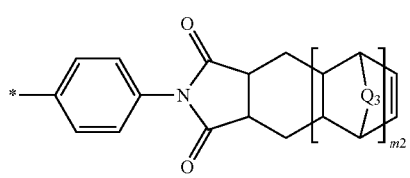

In Chemical Formula 6-4, $Q_3$ is a methylene group, O, or S, and m2 is 0 to about 2, specifically about 1.

[Chemical Formula 6-5]

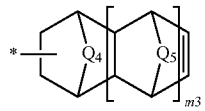

In Chemical Formula 6-5, $Q_4$ and $Q_5$ are independently a methylene group, O, or S, and m3 is 0 to about 2, specifically about 1.

[Chemical Formula 6-6]

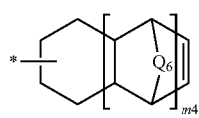

In Chemical Formula 6-6, $Q_6$ is a methylene group, O, or S, and m4 is 0 to about 2, specifically about 1.

[Chemical Formula 6-7]

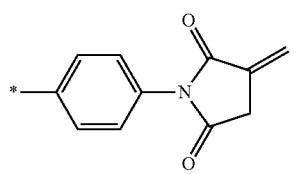

In Chemical Formulae 6-1 to 6-7, each hydrogen is unsubstituted, or is independently substituted with a halogen, a substituted or unsubstituted C1 to C20 alkyl group, a substituted or unsubstituted C1 to C20 alkoxy group, a substituted or unsubstituted C6 to C30 aryl group, a substituted or unsubstituted C6 to C30 aryloxy group, or a combination thereof.

Examples of Z include an acetylene group, a propargyl ether group, a benzocyclobutene group, an (iso)cyanate group, or a derivative thereof.

While not wanting to be bound by theory, it is understood that because a thermosetting resin includes repeating units having a side chain which is linked with a thermosetting functional group, a cross-linking reaction may occur between the cross-linking functional groups during a high-temperature curing process and thereby a solid and stable structure having a network shape may be formed of polymer chains. As a result, the coefficient of thermal expansion may be decreased and the material may have a high glass transition temperature or the material may not have a glass transition temperature, and thus when the thermosetting resin is applied to (e.g., used to form) a flexible printed circuit ("FPC"), the thermosetting resin may have not only improved mechanical properties but also excellent electrical characteristics such as signal delay prevention. Also, although a backbone and a product before the curing process have a low molecular weight, the thermosetting resin may be substantially solid, and may have a structurally solid matrix form. The thermosetting resin may have a number average molecular weight of about 500 to about 1,000,000, specifically 1000 to 100,000, more specifically 10,000 Daltons.

A method for preparing the thermosetting resin represented by Chemical Formula 1 according to an embodiment is not limited, and the thermosetting resin represented by Chemical Formula 1 may be prepared using melt polymerization or solvent polymerization.

To describe an example of a method for preparing a resin based on the melt polymerization, a thermosetting resin according to an embodiment may be prepared through a polycondensation reaction by heating a mixture comprising that includes: (A) a phenol-based resin, an aniline-based resin, or a combination thereof; (B) an aromatic monomer or oligomer including at least one of —OH and NH$_2$ and including C(O)OH; and (C) a thermosetting functional group. Hereafter, each component will be described in detail.

(A) Phenol-Based Resin, Aniline-Based Resin, or Combination Thereof.

The phenol-based resin, aniline-based resin, or a combination thereof may be a phenol-based resin such as a phenol novolac resin, a cresol novolac resin, a naphthol modified novolac resin, a bisphenol A novolac resin, a bisphenol F novolac resin, a biphenyl epoxy resin, a triphenyl resin, a phenyl alkyl resin, a terpene resin, or the like; a dicyclopentadiene resin having a cyclopentadiene backbone; a naphthalene resin having a naphthalene backbone; a bisphenol A resin; a bisphenol F resin; a dihydroxybenzopyran resin; an amine resin made from a polyamine such as aminophenylmethane; or the like, or a combination thereof. In one embodiment, the following Chemical Formulae 7-1 to 7-7 may be exemplified.

[Chemical Formula 7-1]

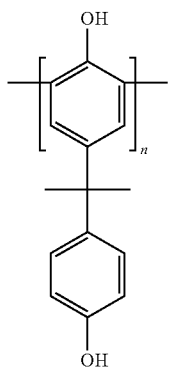

[Chemical Formula 7-2]

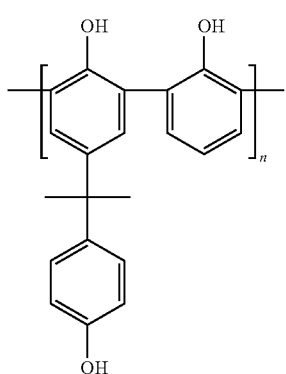

[Chemical Formula 7-3]

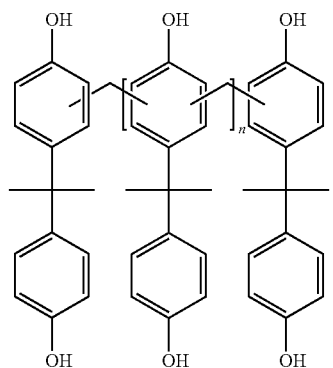

[Chemical Formula 7-4]

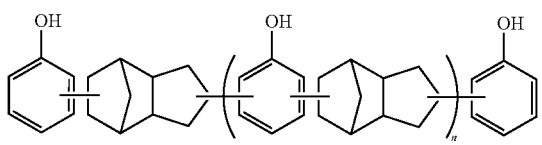

[Chemical Formula 7-5]

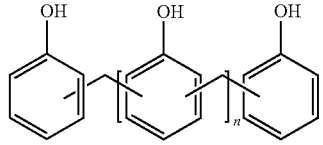

[Chemical Formula 7-6]

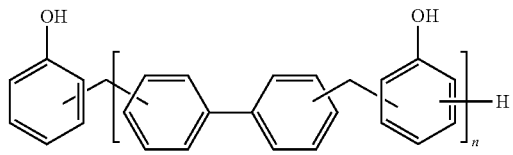

[Chemical Formula 7-7]

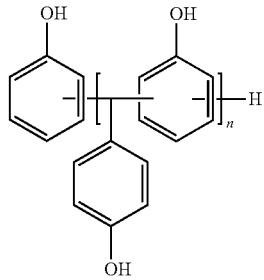

In Chemical Formulae 7-1 to 7-7, the repeating unit is unsubstituted, or some or all carbons of the aromatic ring of the repeating unit are substituted with a substituted or unsubstituted C1-C20 alkyl group, a substituted or unsubstituted C1-C20 alkoxy group, a substituted or unsubstituted C6-C30 aryl group, a substituted or unsubstituted C6-C30 cycloalkyl group, a substituted or unsubstituted C1-C20 aliphatic group including a double bond or a triple bond, or a combination thereof, and n is an integer ranging from 1 to about 50, specifically about 2 to about 40, more specifically about 4 to about 30.

(B) Monomer or Oligomer Including at Least One of —OH and NH$_2$ and at Least One C(O)OH The monomer or oligomer includes at least one of —OH and NH$_2$, and at least one C(O)OH, and it may include a substituted or unsubstituted aromatic cyclic group. The aromatic cyclic group has a cyclic structure in which unsaturated bonds, lone pairs, and the like are mixed. Thus the electrons of a functional group may be delocalized and various resonance forms may exist. For example, the aromatic cyclic group may include a C5-C20 cycloalkenyl group, a C4-C20 heterocycloalkenyl group, a C6-C30 aryl group, a C2-C30 heteroaryl group, a C2-C30 heteroaryloxy group, or the like, or a combination thereof. The term "hetero" refers to one including a heteroatom of N, O, S, or P in an aromatic ring. The liquid crystal oligomer may include at least two different aromatic cyclic groups at the backbone.

In an embodiment, the aromatic cyclic groups may be of at least any one selected from the following Chemical Formulae 5-1 to 5-4.

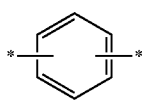
[Chemical Formula 5-1]

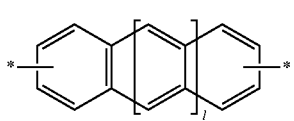
[Chemical Formula 5-2]

In Chemical Formula 5-2, l is an integer ranging from 0 to about 3.

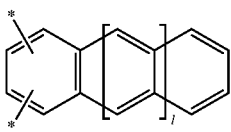
[Chemical Formula 5-3]

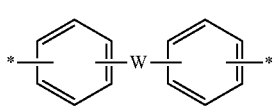
[Chemical Formula 5-4]

In Chemical Formula 5-4, W is selected from a single bond, O, S, CO, SO, $SO_2$, —N=N—, —C=N—, a substituted or unsubstituted C1 to C20 alkylene group, a substituted or unsubstituted C1 to C20 alkenyl group, a substituted or unsubstituted C6 to C30 arylene group, CONR', a linker of the following Chemical Formula 5-4a, and a linker of the following Chemical Formula 5-4b, where R is selected from hydrogen, a substituted or unsubstituted C1 to C20 alkyl group, a substituted or unsubstituted C6 to C30 aryl group, and a substituted or unsubstituted C6 to C30 aryloxy group, and the aromatic ring may include at least one heteroatom such as N, O, S, and P.

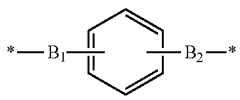
[Chemical Formula 5-4a]

In Chemical Formula 5-4a, $B_1$ and $B_2$ are independently linkers selected from O, S, CO, SO, and $SO_2$.

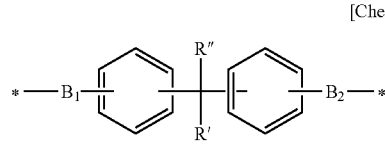
[Chemical Formula 5-4b]

In Chemical Formula 5-4b, $B_1$ and $B_2$ are independently linkers selected from O, S, CO, SO, and $SO_2$, and R' and R" are independently selected from hydrogen, a halogen, a substituted or unsubstituted C1 to C20 alkyl group, a substituted or unsubstituted C1 to C20 haloalkyl group, a substituted or unsubstituted C1 to C20 alkoxy group, a substituted or unsubstituted C6 to C30 aryl group, and a substituted or unsubstituted C6 to C30 aryloxy group.

Examples of the monomer include 4-hydroxybenzoic acid, 3-hydroxybenzoic acid, 2-hydroxybenzoic acid, 2-hydroxy-6-naphthalenecarboxylic acid, 2-hydroxy-5-naphthalenecarboxylic acid, 3-hydroxy-2-naphthalenecarboxylic acid, 2-hydroxy-3-naphthalenecarboxylic acid, 4'-hydroxyphenyl-4-benzoic acid, 3'-hydroxyphenyl-4-benzoic acid, 4'-hydroxyphenyl-3-benzoic acid, 4-aminobenzoic acid, an alkyl-, alkoxy-, or halogen-substituent thereof, and a derivative thereof for producing an ester or an amide. Examples of the monomer include the compound of the following Chemical Formulae 8-1 to 8-5.

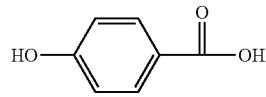
[Chemical Formula 8-1]

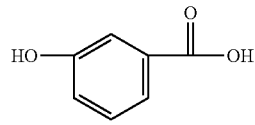
[Chemical Formula 8-2]

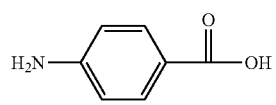
[Chemical Formula 8-3]

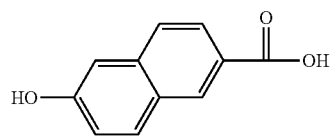
[Chemical Formula 8-4]

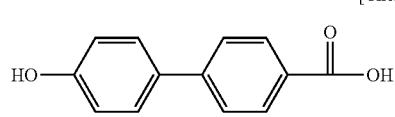
[Chemical Formula 8-5]

(C) Thermosetting Functional Group

A compound including a thermosetting functional group may include at least one selected from the group consisting of the above Chemical Formulae 6-1 to 6-7. In an embodiment, the compound including a thermosetting functional group may include at least one of a maleimide group, a nadimide group, a tetrahydrophthalimide group, an acetylene group, a propargyl ether group, a benzocyclobutene group, an (iso) cyanate group, or a norbornene group.

The thermosetting resin composition includes a thermosetting resin represented by the above Chemical Formula 1.

The thermosetting resin composition may further include a liquid crystal oligomer or polymer. For example, the liquid crystal oligomer or polymer may be represented by the following Chemical Formula 9-1.

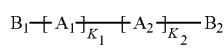

[Chemical Formula 9-1]

In Chemical Formula 9-1, $A_1$ is represented by the following Chemical Formula 9-2, $A_2$ is represented by the following Chemical Formula 9-3, $B_1$ and $B_2$ are respectively thermosetting cross-linking reactive groups, and $K_1$ and $K_2$ are independently integers ranging from 1 to about 50, specifically about 2 to about 40, more specifically about 4 to about 40.

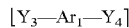

[Chemical Formula 9-2]

In Chemical Formula 9-2, $Y_3$ and $Y_4$ are each independently C(O)O, O, C(O)NR, NR, or CO, where R is hydrogen, a C1-C20 alkyl group, or a C6-C30 aryl group, and $Ar_1$ is a divalent aromatic cyclic group having at least one kink structure of the above Chemical Formulae 5-1 to 5-4.

[Chemical Formula 9-3]

In Chemical Formula 9-3, $Y_5$ and $Y_6$ are independently C(O)O, O, C(O)NR, NR, or CO, where R is hydrogen, a C1-C20 alkyl group, or a C6-C30 aryl group, and $Ar_2$ is at least one selected from the above Chemical Formulae 5-1 to 5-4.

In Chemical Formula 9-1, $B_1$ and $B_2$ are the same or different, and are independently selected from hydrogen, a halogen, a hydroxyl group, a thiol group, an amino group, a maleimide group, a nadimide group, a tetrahydrophthalimide group, an acetylene group, a propargyl ether group, a benzocyclobutene group, a cyanate group, a substituted or unsubstituted C3-C30 alicyclic group including a double bond or a triple bond, a C8-C30 alkenyl group including a C6-C20 aryl substituent, a C8-C30 alkynyl group including a C6-C20 aryl substituent, or a combination thereof.

The alicyclic group may include a C3 to C30 cycloalkyl group, a C3 to C30 cycloalkynyl group, a C3 to C30 cycloalkenyl group, a C3 to C30 heterocycloalkyl group, a C3 to C30 heterocycloalkynyl group, a C3 to C30 heterocycloalkenyl group, or the like. The heterocycloalkyl group, heterocycloalkynyl group, and heterocycloalkenyl group refer to a cycloalkyl group, a cycloalkynyl group, and a cycloalkenyl group, respectively, each including at least one of N, O, S, or P in its ring.

For example, a terminal end of the liquid crystal polymer or oligomer may be one selected from Chemical Formulae 6-1 to 6-7.

The thermosetting resin composition may further include an aprotic solvent. Non-limiting examples of the aprotic solvent include a halogen-based solvent such as 1-chlorobutane, chlorobenzene, 1,1-dichloroethane, 1,2-dichloroethane, chloroform, 1,1,2,2-tetrachloroethane, or the like; an ether-based solvent such as diethylether, tetrahydrofuran, 1,4-dioxane, or the like; a ketone-based solvent such as methylethylketone ("MEK"), acetone, cyclohexanone, or the like; an acetate-based solvent such as propylene glycol monomethyl ether acetate ("PGMEA"); an ester-based solvent such as ethyl acetate or the like; a lactone-based solvent such as γ-butyrolactone or the like; a carbonate-based solvent such as ethylene carbonate, propylene carbonate, or the like; an amine-based solvent such as triethylamine, pyridine, or the like; a nitrile-based solvent such as acetonitrile or the like; an amide-based solvent such as N,N'-dimethyl formamide ("DMF"), N,N'-dimethyl acetamide ("DMAc"), tetramethylurea, N-methylpyrrolidone ("NMP"), or the like; a nitro-based solvent such as nitromethane, nitrobenzene, or the like; a sulfide-based solvent such as dimethyl sulfoxide ("DMSO"), sulfolane, or the like; a phosphoric acid-based solvent such as hexamethylphosphoric acid amide, tri-n-butylphosphoric acid, or the like; or a combination thereof, but is not limited thereto. The aprotic solvent may have a boiling point of about 120° C. to about 250° C., specifically 130° C. to about 240° C., more specifically about 140° C. to about 230° C.

When the thermosetting resin composition includes the solvent, the thermosetting resin composition may include the thermosetting resin according to one embodiment of this disclosure in an amount of about 0.1 to about 300, specifically about 1 to about 250, more specifically about 10 to about 2000, parts by weight, based on 100 parts by weight of the solvent.

Also, the thermosetting resin composition may further include a maleimide-based compound. For example, the maleimide-based compound may include at least one of bismaleimide, or trimaleimide.

The thermosetting resin composition may further include an epoxy-based compound. Accordingly, adherence between the thermosetting resin composition and copper may be improved. The epoxy-based compound may include at least one of a phenol-based glycidylether-type epoxy resin such as a phenol novolac epoxy resin, a cresol novolac epoxy resin, a naphthol modified novolac epoxy resin, a bisphenol A novolac epoxy resin, a bisphenol F novolac epoxy resin, a biphenyl epoxy resin, a triphenyl epoxy resin, a terpene epoxy resin, a phenyl aralkyl epoxy resin, or the like; a dicyclopentadiene epoxy resin having a cyclopentadiene backbone; a bisphenol A epoxy resin, a bisphenol F epoxy resin, or the like; a naphthalene epoxy resin having a naphthalene backbone; a dihydroxybenzopyran epoxy resin; a glycidylamine epoxy resin made from a polyamine such as diamino phenyl methane or the like; a triphenolmethane epoxy resin; a tetraphenylethane epoxy a resin; or a mixture thereof.

The thermosetting resin composition may further include various polymers such as a thermally curable resin, a thermoplastic resin, and an oligomer thereof, as long as the desirable characteristics of the composition for forming a board are not significantly degraded. For example, the thermosetting resin composition may further include at least one of a phosphorous compound such as phosphoric acid ester or phosphoric acid melamine; a nitrogen-containing compound such as melamine or benzoguanamine; an oxazine cycle-included compound; a silicon compound; a polyimide; a polyvinylacetal; a phenoxy resin; an acryl resin; an acryl resin including a hydroxy or carboxyl group; an alkyd resin; an elastomer such as at least one of a polyurethane resin, polybutadiene, a butadiene-acrylonitrile copolymer, polychloroprene, a butadiene-styrene copolymer, polyisoprene, a butyl rubber, a fluoro rubber, a natural rubber, a styrene-isoprene rubber, an acryl rubber, an epoxylated butadiene; or a maleated butadiene; polyethylene; polypropylene; a polyethylene-propylene copolymer; polyvinyl chloride; polyvinylidene chloride; polystyrene; polyvinyl toluene; polyvinyl phenol; an acrylonitrile styrene resin; an acrylonitrile butadiene styrene resin; a (meth)acrylate-butadiene-styrene resin; poly-4-fluoroethylene, fluoroethylene-propylene; 4-fluoroethylene-6- fluoroethylene; vinylidene fluoride; polycarbonate; polyester carbonate; polyphenylene ether; polysulfone; polyester; polyether sulfone; polyamide; polyamide imide; polyester imide; polyphenylene sulfite; (meth)acrylate; epoxy(meth) acrylate; di(meth)acryloxy-bisphenol; poly(meth)acrylate, styrene, vinylpyrrolidone, diacryl phthalate, divinylbenzene, diallylbenzene; diallyl ether bisphenol; trialkenyl isocyanurate; dicyclopentadiene; a phenolic resin; a polymerizable double bond-included monomer, such as an unsaturated polyester or prepolymers thereof; a curable monomer, such as polyisocyanate or prepolymers thereof; or the like, or a combination thereof.

The thermosetting resin composition may further include at least one of a filler, a softening agent, a plasticizer, an antioxidant, a flame retardant, a flame-retardant aid, a lubricant, an anti-static agent, a colorant, a heat stabilizer, a light stabilizer, a UV absorber, or the like.

The filler may include at least one of an organic filler or an inorganic filler. Non-limiting examples of the organic filler include epoxy resin powder, melamine resin powder, urea resin powder, benzoguanamine resin powder, a styrene resin, or the like, or a combination thereof. Non-limiting examples of the inorganic filler include natural silica, fused silica, amorphous silica, hollow silica, aluminum hydroxide, boehmite, magnesium hydroxide, molybdenum oxide, zinc molybdate, zinc borate, zinc stannate, aluminum borate, potassium titanate, magnesium sulfate, silicon carbide, zinc oxide, silicon nitride, silicon dioxide, aluminum titanate, barium titanate, barium strontium titanate, aluminum oxide, alumina, clay, kaolin, talc, calcined clay, calcined kaolin, calcined talc, mica, short glass fiber, or the like. The foregoing may be used singularly or as a mixture of two or more thereof.

Non-limiting examples of the antioxidant include a phosphorous-included antioxidant, a phenolic antioxidant, a sulfur-included antioxidant, or the like. The foregoing may used singularly or as a mixture of two or more thereof.

Non-limiting examples of the plasticizer include polyethylene glycol, a polyamide oligomer, ethylene bis(stearo)amide, ester phthalate, a polystyrene oligomer, liquid paraffin, polyethylene wax, silicone oil, or the like. The foregoing may be used singularly or as a mixture of two or more thereof.

Non-limiting examples of the flame retardant include bromide polystyrene, bromide syndiotactic polystyrene, bromide polyphenylene ether, bromine-included diphenylalkane, bromine-included diphenyl ether, or the like. The foregoing may be used singularly or as a mixture of two or more thereof. In addition, the flame retardant may further include a flame-retardant aid, such as antimony trioxide.

Thermosetting resin composition may be prepared by blending the components in accordance with various methods, such as mixing at room temperature or melt-mixing the same. A film or a prepreg using a thermosetting resin composition may also be provided.

The thermosetting resin composition including a thermosetting resin, a liquid crystal oligomer or a polymer, or the like according to an embodiment may be cast on a board to provide a thin film, and then cured at a high temperature. The thermosetting resin composition may be filtered using a filter, and impurities included in the thermosetting resin composition may be removed before the thermosetting resin composition is coated or impregnated into another material.

When a board is provided by using a mixture comprising a thermosetting resin, or a liquid crystal oligomer or a polymer, the heat resistance of the board may be improved and the dielectric constant of the board may be reduced. In addition, because the thermosetting resin and the liquid crystal oligomer or polymer have high solubility in the solvent, the phase separation does not occur.

According to another embodiment, a prepreg obtained from the thermosetting resin composition is provided. The prepreg may be fabricated by coating or impregnating a reinforcing material with the thermosetting resin composition and drying the same, in which the drying may remove a solvent, if present. The impregnating may include dip coating, roll coating, or the like. Non-limiting examples of the reinforcing material include at least one of a woven glass fiber, a woven alumina glass fiber, a non-woven glass fiber fabric, a non-woven cellulose fabric, a woven carbon fiber, a polymer fabric, or the like. In addition, the prepeg may include a glass fiber, a silica glass fiber, a carbon fiber, an alumina fiber, a silicon carbide fiber, asbestos, rock wool, mineral wool, a woven or non-woven fabric thereof, an aromatic polyamide fiber, a polyimide fiber, a liquid crystal polyester, a polyester fiber, a fluorine fiber, a polybenzoxazole fiber, a glass fiber including a polyamide fiber, a glass fiber including a carbon fiber, a glass fiber including a polyimide fiber, a glass fiber including an aromatic polyester, a glass paper, a mica paper, an alumina paper, a craft paper, a cotton paper, a paper-glass bond paper, or the like. They may be used singularly or as a mixture of two or more thereof.

A copper clad laminate may be fabricated by coating the thermosetting resin composition on a copper foil or casting the same on a copper foil, removing the solvent (if present), and heating the same. Alternatively, the thermosetting resin composition may be impregnated in the reinforcing material, and a heat treatment process may be performed at a semi-cured phase to provide a prepreg, and then the prepreg may be positioned (e.g., disposed) on a copper foil, and the assembly heat treated. In another embodiment, the solvent may be removed by heating under reduced pressure, or by ventilating. The coating of the thermosetting resin composition may be performed by roller coating, dip coating, spray coating, spin coating, curtain coating, slit coating, screen printing, or the like, but is not limited thereto.

A board including the prepreg may be provided. For example, the board may by a flexible printed circuit ("FPC"). The flexible printed circuit ("FPC") may include at least one of a film, a printed board, a copper clad laminate, or a prepreg.

The board may be composed of a circuit-included metal layer and the prepreg. A metal layer may be disposed (e.g., deposited) on the prepreg, pressed, and heated in a press to melt and cure the prepreg. For example, the metal layer may include copper, aluminum, iron, stainless steel, nickel, or the like, or an alloy thereof, or a combination thereof. In addition, the board may be a board in which both surfaces of the prepreg each include a metal layer. The board including prepreg may be varied in many different ways. One surface or both surfaces of the board may each include a conductor pattern, and the conductor pattern may be formed in multiple layers, specifically about 4 layers, about 6 layers, or about 8 layers of a multi-layer structure.

The flexible printed circuit ("FPC") may be a copper clad laminate ("CCL") or a flexible CCL.

Hereinafter, this disclosure is illustrated in further detail with reference to examples. The examples are exemplary embodiments and shall not be limiting.

SYNTHESIS EXAMPLE 1

Preparation of Polymer

A 50 gram (g) quantity of Phenolite SM-2000 (Kangnam Chemical company, EEW 118), 113 g (0.416 mole (mol)) of terahydrophalimidobenzoic acid ("THPI-BA"), and 46.8 g (0.458 mol) of acetic anhydride are put into a 500 milliliter (ml) 4-neck flask. The flask is equipped with a hermetically sealed mechanical agitator, a nitrogen implantation tube, a thermometer, and a reflux condenser. The internal air of the reactor is sufficiently substituted with nitrogen gas, and the temperature inside the reactor is gradually increased to about 140° C. under the flow of the nitrogen gas. Then, reflux is performed for about 3 hours while maintaining the reactor to have an internal temperature of about 140° C.

After an acetylation reaction is terminated, the internal temperature of the reactor is increased to about 200° C. while acetic acid and unreacted acetic anhydride, which are byproducts to be removed, are distilled. A polymer represented by the following Chemical Formula 10-1 is acquired by performing polymerization by heating the reactor for about 3 hours under the foregoing conditions and evacuating the reactor for about the final 30 minutes.

[Chemical Formula 10-1]

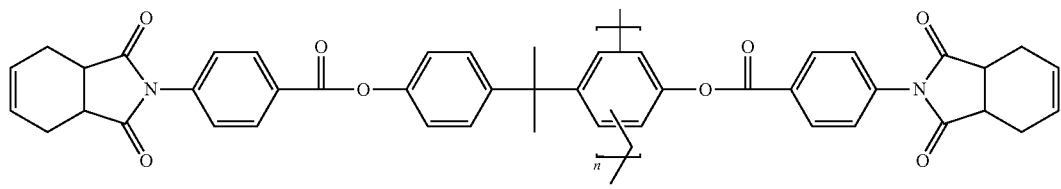

In Chemical Formula 10-1, n is determined according to use amounts of the monomers.

SYNTHESIS EXAMPLE 2

Preparation of Polymer

A 25 g quantity of Phenolite SM-2000, 14.364 g (0.104 mol) of 4-hydroxybenzoic acid, 19.571 g (0.104 mol) of 6-hydroxy-2-naphtoic acid, 56.424 g (0.208 mol) of terahydrophalimidobenzoic acid ("THPI-BA"), and 46.8 g (0.458 mol) of acetic anhydride are put into a 500 ml 4-neck flask.

The reaction conditions are the same as the reaction conditions of Synthesis Example 1, and a polymer represented by the following Chemical Formula 10-2 is acquired as a product.

[Chemical Formula 10-2]

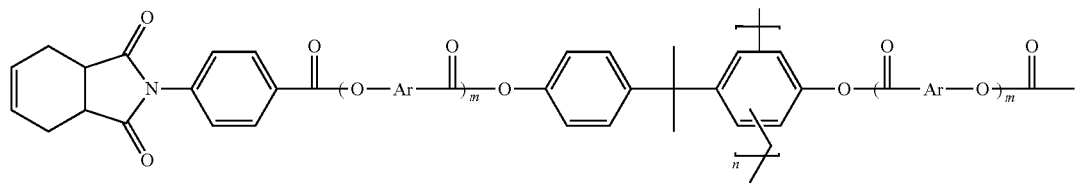

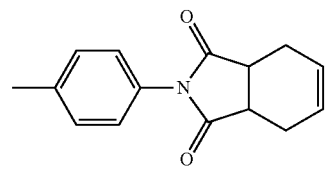

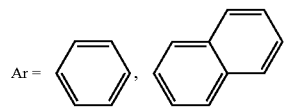

In Chemical Formula 10-2, n and m are determined according to the amount of monomer used. Herein, the sum of each m is 2, and Ar is 1 mol of a phenyl group and 1 mol of a naphthyl group. At least one of the phenyl group-containing repeating units and at least one of the naphthyl group-containing repeating units are randomly arranged.

SYNTHESIS EXAMPLE 3

Preparation of Polymer

A 25 g quantity of Phenolite SM-2000, 29.263 g (0.212 mol) of 4-hydroxybenzoic acid, 39.868 g (0.212 mol) of 6-hydroxy-2-naphtoic acid, 57.472 g (0.212 mol) of terahydrophalimidobenzoic acid ("THPI-BA"), and 71.4 g (0.7 mol) of acetic anhydride are put into a 500 ml 4-neck flask.

The reaction conditions are the same as the reaction conditions of Synthesis Example 1, and a polymer represented by the above Chemical Formula 10-2 is acquired as a product. In Chemical Formula 10-2, the sum of each m is 4, and Ar is 2 mol of a phenyl group and 2 mol of a naphthyl group. At least one of the phenyl group-containing repeating units and at least one of the naphthyl group-containing repeating units are randomly arranged.

SYNTHESIS EXAMPLE 4

Preparation of Polymer

A 25 g quantity of Phenolite SM-2000, 29.263 g (0.212 mol) of 4-hydroxybenzoic acid, 39.868 g (0.212 mol) of 6-hydroxy-2-naphtoic acid, 28.736 g (0.106 mol) of terahydrophalimidobenzoic acid ("THPI-BA"), and 58.4 g (0.572 mol) of acetic anhydride are put into a 500 ml 4-neck flask.

The reaction conditions are the same as the reaction conditions of Synthesis Example 1, and a polymer represented by the following Chemical Formula 10-3 is acquired as a product.

[Chemical Formula 10-3]

In Chemical Formula 10-3, n and m are determined according to use amounts of the monomers. Herein, the sum of each m is 4, and Ar is 2 mol of a phenyl group and 2 mol of a naphthyl group. At least one of the phenyl group-containing repeating units and at least one of the naphthyl group-containing repeating units are randomly arranged. Also, x exists in a structure of hydrogen, acetyl, or tetrahydrobenzoyl, and the proportion of hydrogen/acetyl/tetrahydrobenzoyl is 2/3/5.

SYNTHESIS EXAMPLE 5

Synthesis of Liquid Crystal Oligomer with Capped Hydroxyl Group-Terminal End

A 29.9 g (0.18 mol) quantity of isophthalic acid, 16.9 g (0.09 mol) of 6-hydroxy-2-naphtoic acid, 18.6 g (0.135 mol) of 4-hydroxy-benzoic acid, 24.6 g (0.225 mol) of 4-aminophenol, and 68.9 g (0.675 mol) of acetic anhydride are put into a 500 ml 4-neck flask. The flask is equipped with a hermetically sealed mechanical agitator, a nitrogen implantation tube, a thermometer, and a reflux condenser. The internal air of the reactor is sufficiently substituted with nitrogen gas, the internal temperature of the reactor is gradually increased to about 140° C. under the flow of nitrogen gas, and reflux is performed for about 3 hours while maintaining the internal temperature of the reactor at about 140° C. Subsequently, 8.5 g (0.045 mol) of 6-hydroxy-2-naphtoic acid is added to the reactor, and a soluble liquid crystal amide-ester oligomer having a hydroxyl group represented by the following Chemical Formula 10-4 is prepared by increasing the temperature to about 270° C. and performing a reaction for about 30 minutes while removing acetic acid and unreacted acetic anhydride, which are reaction byproducts.

[Chemical Formula 10-4]

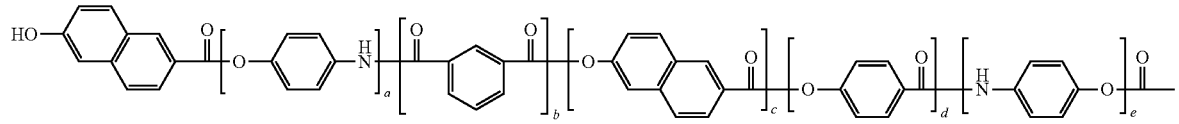

Herein, a, b, c, and d are determined according to the amount of the monomer used.

EXAMPLE 1

Preparation of Prepreg

A mixed solution is prepared by putting 6.0 g of a polymer acquired from Synthesis
Example 1, 6.0 g of a polymer acquired from Synthesis Example 5, 4,4'-bismaleimidodiphenylmethane (BMI-1000, Daiwa Kasei company), 4.0 g of Araldite MY-721 (Huntsman company), and 4.0 g of a curing catalyst dicyandiimide ("DICY") into 30 g of N-methylpyrrolidone ("NMP"). Glass fiber 1078 having the dimensions 40×40×0.05 millimeters (mm) in size is put on an electrolyte copper foil fixed on a glass plate, and the prepared mixed solution is evenly impregnated into the glass fiber. A prepreg is acquired by curing the specimen, which is impregnated for about 100 minutes, by increasing the temperature from room temperature to about 200° C. in a high-temperature furnace, and removing the copper foil by treating the cured specimen with 50 parts by weight of a nitric acid solution. Herein, the weight of the polymer based on the total weight of the prepreg is about 52 wt %.

EXAMPLE 2

Preparation of Prepreg

A prepreg is acquired according to the same method as Example 1, except that a mixed solution is prepared by putting 6.0 g of a polymer acquired from Synthesis Example 2, 6.0 g of a polymer acquired from Synthesis Example 5, 4.0 g of 4,4'-bismaleimidodiphenylmethane (BMI-1000, Daiwa Kasei company), 4.0 g of Araldite MY-721 (Huntsman company), and 0.04 g of a curing catalyst dicyandiimide ("DICY") into 30 g of N-methylpyrrolidone ("NMP"). Herein, the weight of the polymer based on the total weight of the prepreg is about 54 wt %.

EXAMPLE 3

Preparation of Prepreg

A prepreg is acquired according to the same method as Example 1, except that a mixed solution is prepared by putting 12.0 g of a polymer acquired from Synthesis Example 3, 4.0 g of 4,4'-bismaleimidodiphenylmethane (BMI-1000, Daiwa Kasei company), 4.0 g of Araldite MY-721 (Huntsman company), and 0.04 g of a curing catalyst dicyandiimide ("DICY") into 30 g of N-methylpyrrolidone ("NMP"). Herein, the weight of the polymer based on the total weight of the prepreg is about 56 wt %.

EXAMPLE 4

Preparation of Prepreg

A prepreg is acquired according to the same method as Example 1, except that a mixed solution is prepared by putting 6.0 g of a polymer acquired from Synthesis Example 3, 6.0 g of a polymer acquired from Synthesis Example 5, 4.0 g of 4,4'-bismaleimidodiphenylmethane (BMI-1000, Daiwa Kasei company), 4.0 g of Araldite MY-721 (Huntsman company), and 4.0 g of a curing catalyst dicyandiimide ("DICY") into 30 g of N-methylpyrrolidone ("NMP"). Herein, the weight of the polymer based on the total weight of the prepreg is about 56 wt %.

EXAMPLE 5

Preparation of Prepreg

A prepreg is acquired according to the same method as Example 1, except that a mixed solution is prepared by putting 9.0 g of a polymer acquired from Synthesis Example 3, 3.0 g of a polymer acquired from Synthesis Example 5, 4.0 g of 4,4'-bismaleimidodiphenylmethane (BMI-1000, Daiwa Kasei company), 4.0 g of Araldite MY-721 (Huntsman company), and 0.04 g of a curing catalyst dicyandiimide ("DICY") into 30 g of N-methylpyrrolidone ("NMP"). Herein, the weight of the polymer based on the total weight of the prepreg is about 56 wt %.

EXAMPLE 6

Preparation of Prepreg

A prepreg is acquired according to the same method as Example 1, except that a mixed solution is prepared by putting 16.0 g of a polymer acquired from Synthesis Example 4 and 4.0 g of 4,4'-bismaleimidodiphenylmethane (BMI-1000, Daiwa Kasei company) into 30 g of N-methylpyrrolidone ("NMP"). Herein, the weight of the polymer based on the total weight of the prepreg is about 52 wt %.

EXAMPLE 7

Preparation of Prepreg

A prepreg is acquired according to the same method as Example 1, except that a mixed solution is prepared by putting 12.0 g of a polymer acquired from Synthesis Example 4, 4.0 g of 4,4'-bismaleimidodiphenylmethane (BMI-1000, Daiwa Kasei company), 4.0 g of Araldite MY-721 (Huntsman company), and 0.04 g of a curing catalyst dicyandiimide ("DICY") into 30 g of N-methylpyrrolidone ("NMP"). Herein, the weight of the polymer based on the total weight of the prepreg is about 58 wt %.

Thermosetting Characteristic of Polymer

Figure 2:
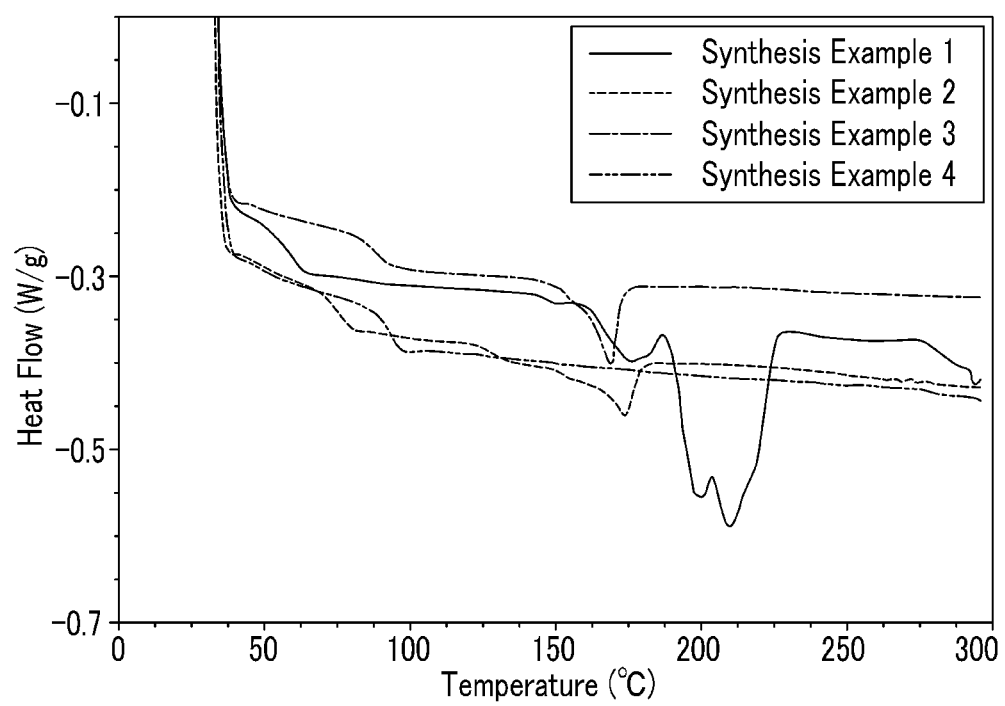
FIG. 2 is a differential scanning calorimetry ("DSC") graph of heat flow (Watts per gram, W/g) versus temperature (degrees centigrade, °C.) of the compounds prepared according to Synthesis Examples 1 to 4.

Thermogravimetric analysis ("TGA") and differential scanning calorimetry ("DSC") analysis are performed on the polymers prepared according to Synthesis Examples 1 to 4, and the analysis results are presented in FIGS. 1 and 2.

Referring to FIGS. 1 and 2, because curing of the polymers is completed at a temperature lower than about 300° C., when curing of a polymer is performed at about 300° C.; the extent of the curing of the polymer may be high.

Evaluation of Thermal Property of Prepreg

Glass transition temperatures (Tg) and coefficients of thermal expansion ("CTE") of the prepared prepreg specimens are measured with a thermomechanical analyzer ("TMA", TA Instruments TMA 2940), and the measurement results are presented in Table 1. The coefficients of thermal expansion ("cm") are measured in the atmosphere of nitrogen while increasing the temperature at a rate of 10 degrees centigrade per minute (° C./min).

Evaluation of Dielectric Constant Characteristic of Prepreg

Semi-cured glass fiber prepregs were prepared by impregnating a resin composition into glass fiber. A copper foil laminate having a total thickness of more than about 300 micrometers (μm) is fabricated by laminating 8 sheets of the prepared prepreg, disposing copper foil on both sides of the prepreg laminate, and laminating the prepreg laminate with the copper foil by using a press at about 200° C. for about 100 minutes. A prepreg without the copper foil is fabricated by, treating the copper foil laminate with 50 parts by weight of a nitric acid solution, and then the impedance constant of the prepreg without the copper foil is measured at about 1 gigahertz (GHz) by using a radio frequency ("RF") impedance analyzer (E4991A, Agilent company).

Evaluation of Peel Strength of Copper foil

A copper foil is peeled in a width of about 1 centimeter (cm) from the surface of a copper foil laminate, and the peel strength of the copper foil is measured by using a tensile strength measuring instrument (Universal Testing machine). (90 degree Peel Test, crosshead speed: 50 millimeters per minute, mm/min)

TABLE 1

|  | Example 1 | Example 2 | Example 3 | Example 4 | Example 5 | Example 6 | Example 7 |
|---|---|---|---|---|---|---|---|
| Glass transition temperature (° C.) | — | — | — | — | — | | — |
| Coefficient of thermal expansion (ppm/° C.) | 14.3 | 14.9 | 17.0 | 15.0 | 15.5 | 13.3 | 19.9 |
| Peel strength (kgf/cm) | 0.80 | 0.86 | 0.93 | 0.96 | 0.91 | — | 0.94 |
| Dielectric constant (at 1 GHz) | — | — | 3.04 | 3.65 | 3.22 | — | — |

In Table 1., ppm/° C. refers to parts per million per degrees centigrade, kgf/cm refers to kilograms force per centimeter.

Referring to Table 1, Examples 1 to 7 had low coefficients of thermal expansion ("CTE"), and glass transition temperatures did not appear. Also, the dielectric constants at about 1 GHz were maintained at about equal to or less than about 3.6, and as the content of a resin is increased, the dielectric constant is decreased. Accordingly, if they were applied to flexible printed circuits ("FPC"), the flexible printed circuits may have excellent electrical characteristics such as substantially reduced or effectively prevented signal delay.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thermosetting resin comprising at least one repeating unit represented by the following Chemical Formula 1:

[Chemical Formula 1]

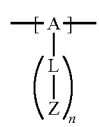

wherein, in Chemical Formula 1,

A is a phenol-based functional group, an aniline-based functional group, or a combination thereof, L is C(O)O, C(O)NR' wherein R' is hydrogen, a substituted or unsubstituted C1 to C20 alkyl group, a substituted or unsubstituted C6 to C30 aryl group, or a substituted or unsubstituted C6 to C30 aryloxy group, an aromatic ester, an aromatic ester-imide, an aromatic ester-amide, an aromatic amide, or a combination thereof, Z is a substituted or unsubstituted aliphatic group including a double bond or a triple bond, a substituted or unsubstituted alicyclic group including a double bond or a triple bond, a substituted or unsubstituted aryl group including a double bond or a triple bond, (iso)cyanate, a derivative thereof, or a combination thereof, and n is an integer ranging from 1 to about 4.

2. The thermosetting resin of claim 1, wherein A is at least one selected from the following Chemical Formulae 2-1 to 2-3:

[Chemical Formula 2-1]

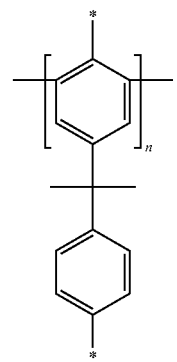

[Chemical Formula 2-2]

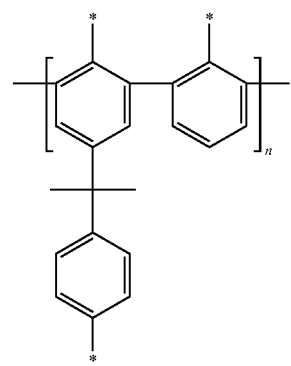

[Chemical Formula 2-3]

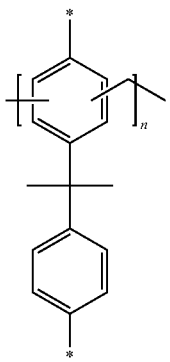

wherein, in Chemical Formulae 2-1 to 2-3,
the repeating unit is unsubstituted, or some or all hydrogens of the aromatic ring of the repeating unit are substituted with a substituted or unsubstituted C1-C20 alkyl group, a substituted or unsubstituted C1-C20 alkoxy group, a substituted or unsubstituted C6-C30 aryl group, a substituted or unsubstituted C6-C30 cycloalkyl group, a substituted or unsubstituted C1-C20 aliphatic group including a double bond or a triple bond, or a combination thereof,
n is an integer ranging from 1 to about 50, and
* indicates a linkage to the L group.

3. The thermosetting resin of claim 1, wherein L comprises a repeating unit of the following Chemical Formula 3:

$-\!\!+\!\!X_1\!-\!\!Ar\!-\!\!Y_1\!\!+\!\!-$  [Chemical Formula 3]

wherein, in Chemical Formula 3,
Ar is independently a substituted or unsubstituted C6-C30 aromatic cyclic group, and Ar includes at least one aromatic cyclic group; and
$X_1$ and $Y_1$ are independently selected from C(O)O, O, C(O)NR', and NR", where R' and R" are independently hydrogen, a substituted or unsubstituted C1 to C20 alkyl group, a substituted or unsubstituted C6 to C30 aryl group, or a substituted or unsubstituted C6 to C30 aryloxy group, provided that at least one of $X_1$ and $Y_1$ are C(O)O or C(O)NR.

4. The thermosetting resin of claim 1, wherein L comprises at least one of the following Chemical Formulae 4-1 to 4-3:

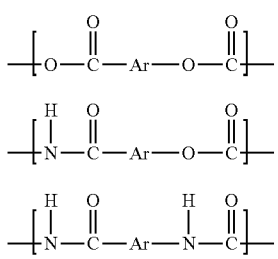

wherein, in Chemical Formulae 4-1 to 4-3,
Ar is independently a substituted or unsubstituted C6-C30 aromatic cyclic group, and Ar includes at least one aromatic cyclic group.

5. The thermosetting resin of claim 4, wherein the aromatic cyclic group comprises at least one selected from the following Chemical Formulae 5-1 to 5-4:

[Chemical Formula 5-1]

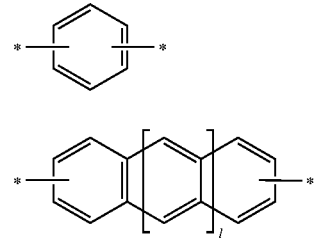

[Chemical Formula 5-2]

wherein, in Chemical Formula 5-2, l is an integer ranging from 0 to about 3,

[Chemical Formula 5-3]

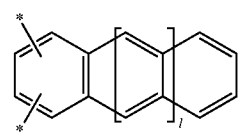

wherein in Chemical Formula 5-3, l is an integer ranging from 0 to about 3,

[Chemical Formula 5-4]

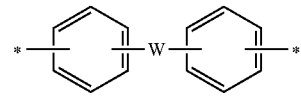

wherein, in Chemical Formula 5-4, W is selected from a single bond, O, S, CO, SO, $SO_2$, —N=N—, —C=N—, a substituted or unsubstituted C1 to C20 alkylene group, a substituted or unsubstituted C1 to C20 alkenyl group, a substituted or unsubstituted C6 to C30 arylene group, C(O)NR', where R' is selected from hydrogen, a substituted or unsubstituted C1 to C20 alkyl group, a substituted or unsubstituted C6 to C30 aryl group, and a substituted or unsubstituted C6 to C30 aryloxy group, and
at least one CH of the aromatic ring is unsubstituted, or replaced by at least one heteroatom selected from N, O, S, and P.

6. The thermosetting resin of claim 1, wherein Z comprises at least one of the following Chemical Formulae 6-1 to 6-7:

[Chemical Formula 6-1]

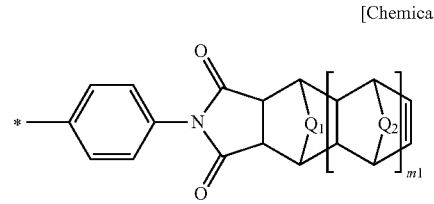

wherein, in Chemical Formula 6-1,
$Q_1$ and $Q_2$ are independently a methylene group, O, or S, and m1 is 0 to 2,

[Chemical Formula 6-2]

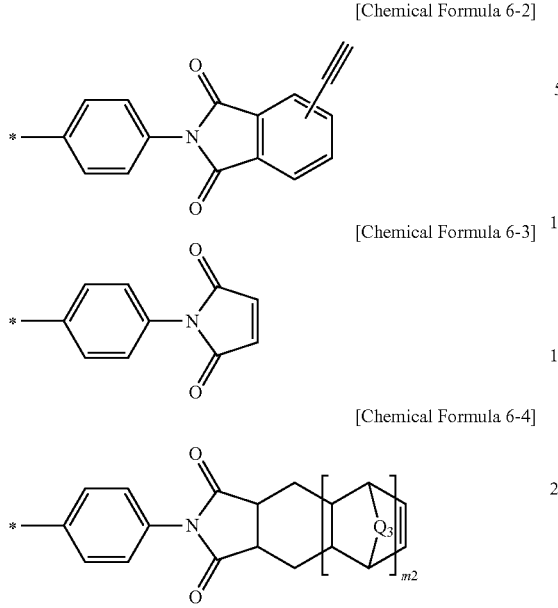

[Chemical Formula 6-3]

[Chemical Formula 6-4]

wherein, in Chemical Formula 6-4,
$Q_3$ is a methylene group, O, or S, and m2 is 0 to 2,

[Chemical Formula 6-5]

wherein, in Chemical Formula 6-5,
$Q_4$ and $Q_5$ are independently a methylene group, O, or S, and m3 is 0 to 2,

[Chemical Formula 6-6]

wherein, in Chemical Formula 6-6,
$Q_6$ is a methylene group, O, or S, and m4 is 0 to 2,

[Chemical Formula 6-7]

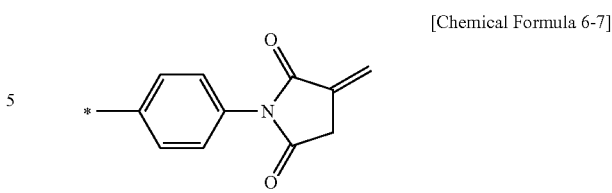

wherein, in Chemical Formulae 6-1 to 6-7,
each carbon is unsubstituted, or is independently substituted with a halogen, a substituted or unsubstituted C1 to C20 alkyl group, a substituted or unsubstituted C1 to C20 alkoxy group, a substituted or unsubstituted C6 to C30 aryl group, a substituted or unsubstituted C6 to C30 aryloxy group, or a combination thereof.

7. A thermosetting resin composition comprising the thermosetting resin according to claim 1.

8. The thermosetting resin composition of claim 7, wherein the composition further comprises a liquid crystal oligomer or polymer.

9. The thermosetting resin composition of claim 7, wherein the composition further comprises an aprotic solvent.

10. The thermosetting resin composition of claim 7, wherein the composition further comprises a maleimide-based compound.

11. The thermosetting resin composition of claim 7, wherein the composition further comprises an epoxy compound.

12. A prepreg manufactured using the thermosetting resin composition according to claim 7.

13. A film manufactured using the thermosetting resin composition according to claim 7.

14. A board manufactured using the thermosetting resin composition according to claim 7.

15. The board of claim 14, wherein the board is a copper clad laminate or a flexible copper clad laminate.

16. The board of claim 14, wherein the board further comprises a prepreg.

17. The board of claim 16, wherein the board further comprises a metal layer on either side or both sides of the prepreg.

* * * * *